US010216658B2

(12) United States Patent
Chen et al.

(10) Patent No.: US 10,216,658 B2
(45) Date of Patent: Feb. 26, 2019

(54) REFRESHING OF DYNAMIC RANDOM ACCESS MEMORY

(71) Applicant: VIA Alliance Semiconductor Co., Ltd., Shanghai (CN)

(72) Inventors: Chen Chen, Beijing (CN); Peng Shen, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 49 days.

(21) Appl. No.: 15/599,818

(22) Filed: May 19, 2017

(65) Prior Publication Data
US 2018/0232329 A1    Aug. 16, 2018

(30) Foreign Application Priority Data

Feb. 16, 2017    (CN) .......................... 2017 1 0083491

(51) Int. Cl.
*G06F 13/16* (2006.01)
*G06F 9/38* (2018.01)
(Continued)

(52) U.S. Cl.
CPC ........ *G06F 13/1684* (2013.01); *G06F 9/3838* (2013.01); *G06F 9/3855* (2013.01); *G06F 13/1668* (2013.01); *G11C 11/40603* (2013.01); *G11C 11/40615* (2013.01); *G11C 11/40618* (2013.01); *G11C 16/0483* (2013.01); *G11C 16/10* (2013.01); *G11C 16/24* (2013.01); *G11C 16/26* (2013.01); *H05K 2201/10159* (2013.01)

(58) Field of Classification Search
CPC ............. G11C 11/406; G11C 11/40618; G06F 13/1636
See application file for complete search history.

(56) References Cited

U.S. PATENT DOCUMENTS 7,120,077 B2   10/2006   Jakobs
9,032,141 B2    5/2015   Bains et al.
(Continued)

FOREIGN PATENT DOCUMENTS

CN    101091221 A    12/2007
CN    103559142 A    2/2014
(Continued)

OTHER PUBLICATIONS

Notice of Allowance dated Mar. 16, 2018, issued in U.S. Appl. No. 15/599,859.

*Primary Examiner* — Gary W. Cygiel
(74) *Attorney, Agent, or Firm* — McClure, Qualey & Rodack, LLP

(57) ABSTRACT

A schedule for refreshing a dynamic random access memory (DRAM). Access commands for a DRAM are queued in a command queue. A microcontroller uses a counter to count how many times a rank of the DRAM is refreshed entirely (whether by a one-time per-rank refresh operation or by a series of per-bank refresh operations). When the counter has not reached an upper limit and no access command corresponding to the rank is waiting in the command queue, the microcontroller repeatedly performs the per-rank refresh operation on the rank. Every refresh inspection interval, the microcontroller decreases the counter by 1.

14 Claims, 6 Drawing Sheets

(51) Int. Cl.
*G11C 11/406* (2006.01)
*G11C 16/04* (2006.01)
*G11C 16/10* (2006.01)
*G11C 16/24* (2006.01)
*G11C 16/26* (2006.01)

(56) References Cited

U.S. PATENT DOCUMENTS

| | | |
|---|---|---|
| 9,299,400 B2 | 3/2016 | Bains et al. |
| 9,576,637 B1 * | 2/2017 | Balakrishnan ........ G06F 3/0611 |
| 2005/0108460 A1 * | 5/2005 | David ................... G11C 11/406 |
| | | 711/5 |
| 2006/0271739 A1 | 11/2006 | Tsai et al. |
| 2016/0254044 A1 | 9/2016 | Bains et al. |

FOREIGN PATENT DOCUMENTS

| | | | |
|---|---|---|---|
| CN | 102655022 A | 6/2016 | |
| CN | 106128499 A | 11/2016 | |
| TW | 200817913 A | 4/2008 | |
| TW | 201039345 A | 11/2010 | |

\* cited by examiner

REFRESHING OF DYNAMIC RANDOM ACCESS MEMORY

CROSS REFERENCE TO RELATED APPLICATIONS

This Application claims priority of China Patent Application No. 201710083491.4, filed on Feb. 16, 2017, the entirety of which is incorporated by reference herein.

BACKGROUND OF THE INVENTION

Field of the Invention

The present invention relates to a schedule for refreshing a dynamic random access memory (DRAM).

Description of the Related Art

A dynamic random access memory (DRAM) is a semiconductor memory, storing binary data, 1 or 0, by controlling the electrons contained in the capacitors. To cope with leakage current from the capacitors, a refresh mechanism is required for DRAM to guarantee data reliability.

BRIEF SUMMARY OF THE INVENTION

A refresh schedule for dynamic random access memory (DRAM) is disclosed in the disclosure.

A DRAM controller in accordance with an exemplary embodiment of the disclosure comprises a command queue and a microcontroller. Access commands waiting to be transmitted to a DRAM are queued in the command queue. The microcontroller uses a counter to count how many times a rank of the DRAM is entirely refreshed. The microcontroller repeatedly performs a per-rank refresh operation on the rank when the counter has not reached an upper limit and no access command corresponding to the rank is waiting in the command queue. The microcontroller decreases the counter by 1 every refresh inspection interval. In this manner, the DRAM is refreshed when the computing resources are free.

A DRAM control method in accordance with an exemplary embodiment of the disclosure comprises the following steps: providing a command queue with access commands queued therein, wherein the access commands are queued in the command queue waiting to be transmitted to a DRAM; using a counter to count how many times a rank of the DRAM is entirely refreshed; repeatedly performing a per-rank refresh operation on the rank when the counter has not reached an upper limit and no access command corresponding to the rank is waiting in the command queue; and decreasing the counter by 1 every refresh inspection interval.

According to the disclosed DRAM controller and DRAM control method, refresh operations for a rank are dynamically scheduled considering whether the rank is idle. Specifically, instead of being refreshed by the per-rank refresh operation every refresh inspection interval, an idle rank is repeatedly refreshed during an earlier refresh inspection interval tREFI by repeating the per-rank refresh operation. The rank that has been repeatedly refreshed during the earlier refresh inspection interval tREFI does not need to be refreshed in the later N refresh inspection intervals (Nx-tREFI). The access commands to the rank, therefore, can be timely executed without being delayed by a conventional refresh routine. In another aspect, when refreshing a specific bank of a specific rank, priority of the access commands to the different banks of the specific rank is further dynamically adjusted. The access commands corresponding to the banks that are not being refreshed at present are given the higher priority to gain the system resources. Access commands for the specific rank, therefore, are not excessively delayed in the command queue.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
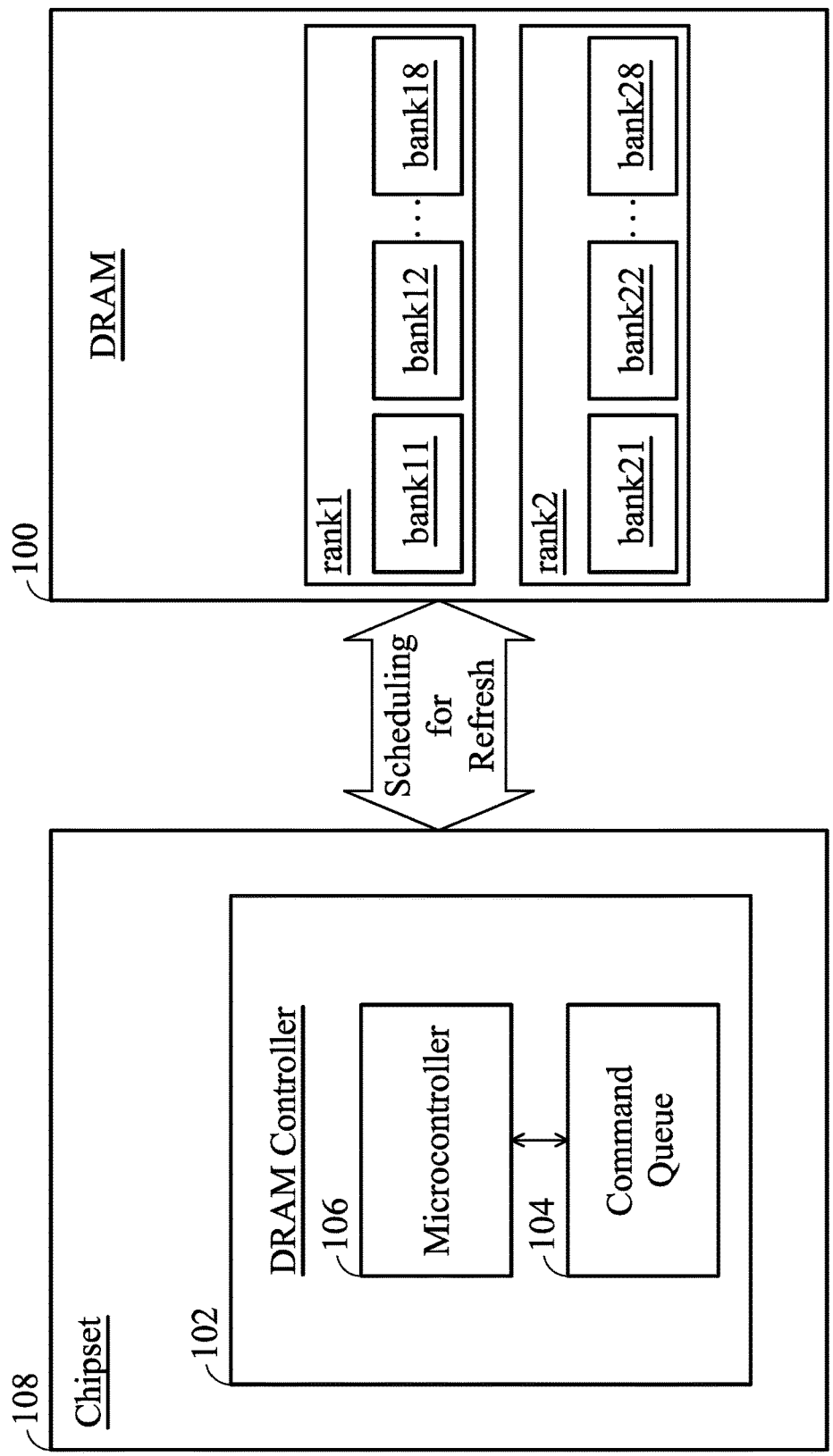
FIG. 1 is a block diagram depicting a dynamic random access memory (DRAM) 100 and a DRAM controller 102.

FIG. 1 is a block diagram depicting a dynamic random access memory (DRAM) 100 and a DRAM controller 102. The DRAM controller 102 comprises a command queue 104 and a microcontroller 106. The access commands waiting to be transmitted to the DRAM 100 are queued in the command queue 104. The microcontroller 106 runs to optimize the refresh of the DRAM to avoid hampering the access commands waiting in the command queue 104. The microcontroller 106 may include a computing circuit and computing code. The exemplary embodiment shown in FIG. 1 implements the DRAM controller 102 within a chipset 108. In cases where the chipset 108 and a central processing unit (not shown) are integrated in an SoC (System on a Chip), the DRAM controller 102 is fabricated within the SoC. In cases where the chipset 108 contains separate south and north bridges, the DRAM controller 102, specifically, is fabricated in the north bridge of the chipset 108 but it is not intended to be limited thereto.

The memory cells of the DRAM 100 may be accessed via two channels. Each channel is provided to access multiple memory modules, e.g., DIMMs (Dual In-line Memory Modules). Each memory module may include multiple memory chips. The memory chips controlled by the same chip select (CS) signal are regarded as one rank. Referring to FIG. 1, the storage space includes two ranks, rank1 and rank2. The same rank is further divided into a plurality of banks. Each bank is controlled by one set of word lines and bit lines. As shown, the storage space of the rank rank1 includes eight banks bank11 to bank18, and the storage space of the rank rank2 includes eight banks bank21 to bank28.

The DRAM 100 may be refreshed per rank or per bank. One rank may be wholly refreshed by one per-rank refresh operation or by a series of per-bank refresh operations. The time required for one per-rank refresh operation is labeled tRFCpr. During the time interval tRFCpr, the whole rank should be protected from being accessed. The time required for one per-bank refresh operation is labeled tRFCpb. During one time interval tRFCpb, only the bank that is being refreshed should be protected from being accessed. The time interval tRFCpr is generally much longer than the time interval tRFCpb. In an exemplary embodiment, the time interval tRFCpr is up to 210 ns and the time interval tRFCpb is up to 90 ns. A refresh inspection interval (labeled tREFI) is introduced to schedule the refresh operations of the DRAM 100. One rank, ideally, should be wholly refreshed (no matter whether it be by one per-rank refresh operation or by a series of per-bank refresh operations) once during every refresh inspection interval tREFI. In this disclosure, however, the per-rank refresh operation may be repeated several times first and then be ignored in the following refresh inspection intervals. For example, a rank refreshed by repeating the per-rank refresh operation eight times during one refresh inspection interval may not be refreshed in the later eight refresh inspection intervals. In another exemplary embodiment, the per-rank refresh operation may be halted first and then be repeated several times in a later refresh inspection interval. For example, a rank that has not been refreshed for eight continuous refresh inspection intervals may be refreshed by repeating the per-rank refresh operation eight times in the ninth refresh inspection interval. In an exemplary embodiment, the refresh inspection interval tREFI may be 7.8 us or 3.9 us long, much longer than the time intervals tRFCpr and tRFCpb.

Figure 2:
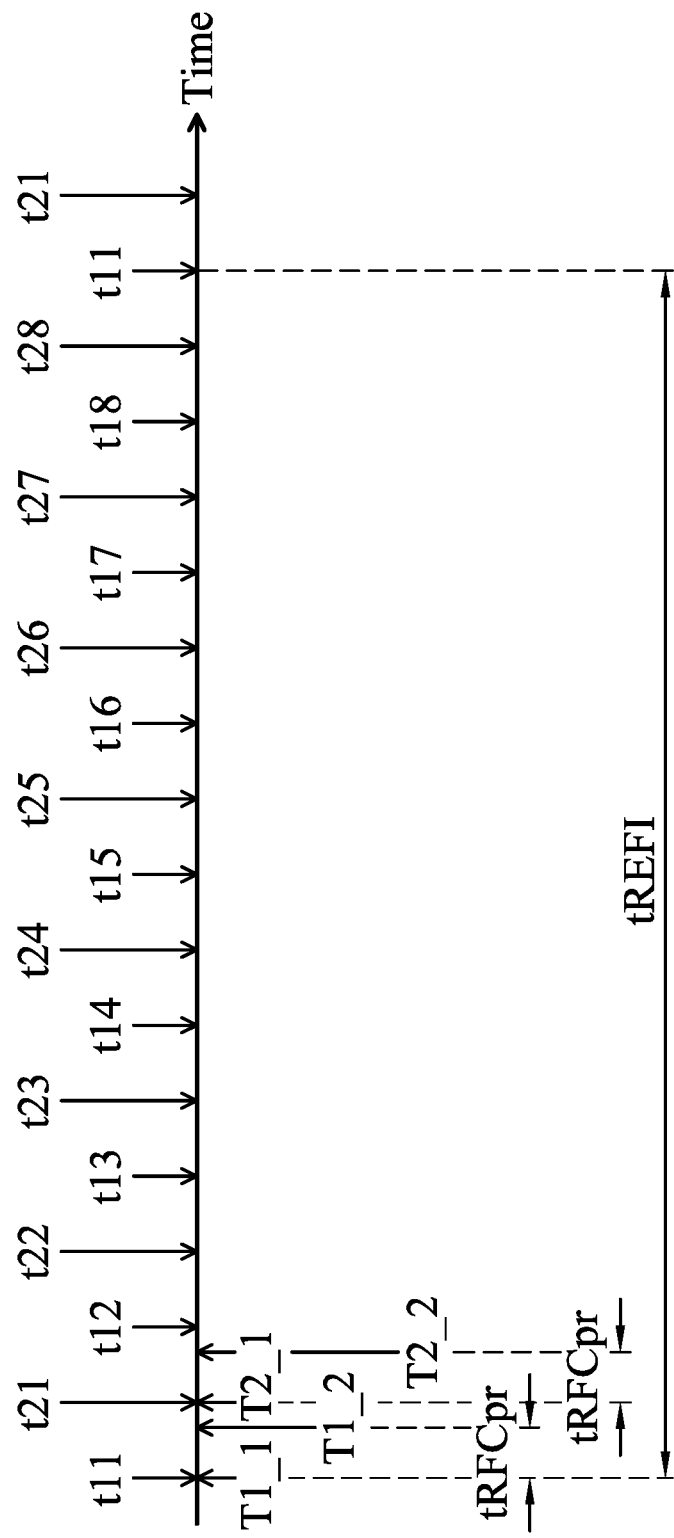
FIG. 2 is a timing diagram depicting how to schedule a refresh inspection interval tREFI in accordance with an exemplary embodiment of the disclosure.

FIG. 2 is a timing diagram depicting how to schedule a refresh inspection interval tREFI in accordance with an exemplary embodiment of the disclosure. As shown, during one refresh inspection interval tREFI, there are first-rank bank-refresh time points t11 to t18 and second-rank bank-refresh time points t21 to t28 which are arranged alternately as t11→t21→t12→t22→t13→t23→t14→t24→t15→t25→t16→t26→t17→t27→t18→t28. The first-rank bank-refresh time points t11 to t18 correspond to the banks bank11 to bank18 of the rank rank1. The second-rank bank-refresh time points t21 to t28 correspond to the banks bank21 to bank28 of the rank rank2. Considering the content queued in the command queue 104, the microcontroller 106 may refresh the banks bank11 to bank18 of the rank rank1 bank-by-bank respectively from the first-rank bank-refresh time points t11 to t18 to entirely refresh the rank rank1. Considering the content queued in the command queue 104, the microcontroller 106 may refresh the banks bank21 to bank28 of the rank rank2 bank-by-bank respectively from the second-rank bank-refresh time points t21 to t28 to entirely refresh the rank rank2. According to the forgoing concept, the different ranks are refreshed alternately bank-by-bank during one refresh inspection interval tREFI. In addition to the aforementioned double rank structure, a memory with four or more ranks can be also refreshed based on a similar concept.

As shown, the first-rank bank-refresh time points t11 to t18 for the rank rank1 may be equally separated (e.g. equally separated by a first time interval) and the second-rank bank-refresh time points t21 to t28 for the rank rank2 may be equally separated (e.g. equally separated by a second time interval). The first-rank bank-refresh time point t11 may be arranged at the beginning of each refresh inspection interval tREFI as shown. The first-rank bank-refresh time point t18 within the current refresh inspection interval may be distant from the first-rank bank-refresh time point t11 in the following refresh inspection interval by the first time interval. The second-rank bank-refresh time point t28 within the current refresh inspection interval may be distant from the second-rank bank-refresh time point t21 in the following refresh inspection interval by the second time interval. In the exemplary embodiment depicted in FIG. 2, the length of the first time interval equals the length of the second time interval. The first-rank bank-refresh time point t11 is distant from the second-rank bank-refresh time point t21 by an identical time interval as that separating the second-rank bank-refresh time point t21 and the first-rank bank-refresh time point t12. According to the forgoing concept, one refresh inspection interval tREFI is equally divided to all banks of the different ranks, rank1 and rank2. A similar concept may be used in a memory having four or more ranks.

As for the per-rank refresh operation, it is preferably being repeatedly performed on the rank(s) idling (without access commands waiting in the command queue 104) in the current refresh inspection interval tREFI. The rank that has been wholly refreshed repeatedly do not require further refresh operations in the later refresh inspection intervals (e.g. in the following Nx(tREFI) time length) and computing resources therefore are not occupied by the refresh operations of the rank. As shown in FIG. 2, the first per-rank refresh operation for the rank rank1 may start from time point T1_1 and, after the time interval tRFCpr, the second per-rank refresh operation for the rank rank1 is repeated from time point T1_2. In an exemplary embodiment, the starting point for the repeated per-rank refresh operations of the same rank may be aligned to the time point allocated for starting refreshing the rank bank-by-bank. As shown, the first per-rank refresh operation for the rank rank2 may start from time point T2_1 and, after the time interval tRFCpr, the second per-rank refresh operation for the rank rank2 is repeated from time point T2_2. The time point T2_2 is aligned to the second-rank bank-refresh time point t21.

For simplicity, only the refresh schedule for the rank rank1 is discussed in the following paragraphs.

Figure 3A:
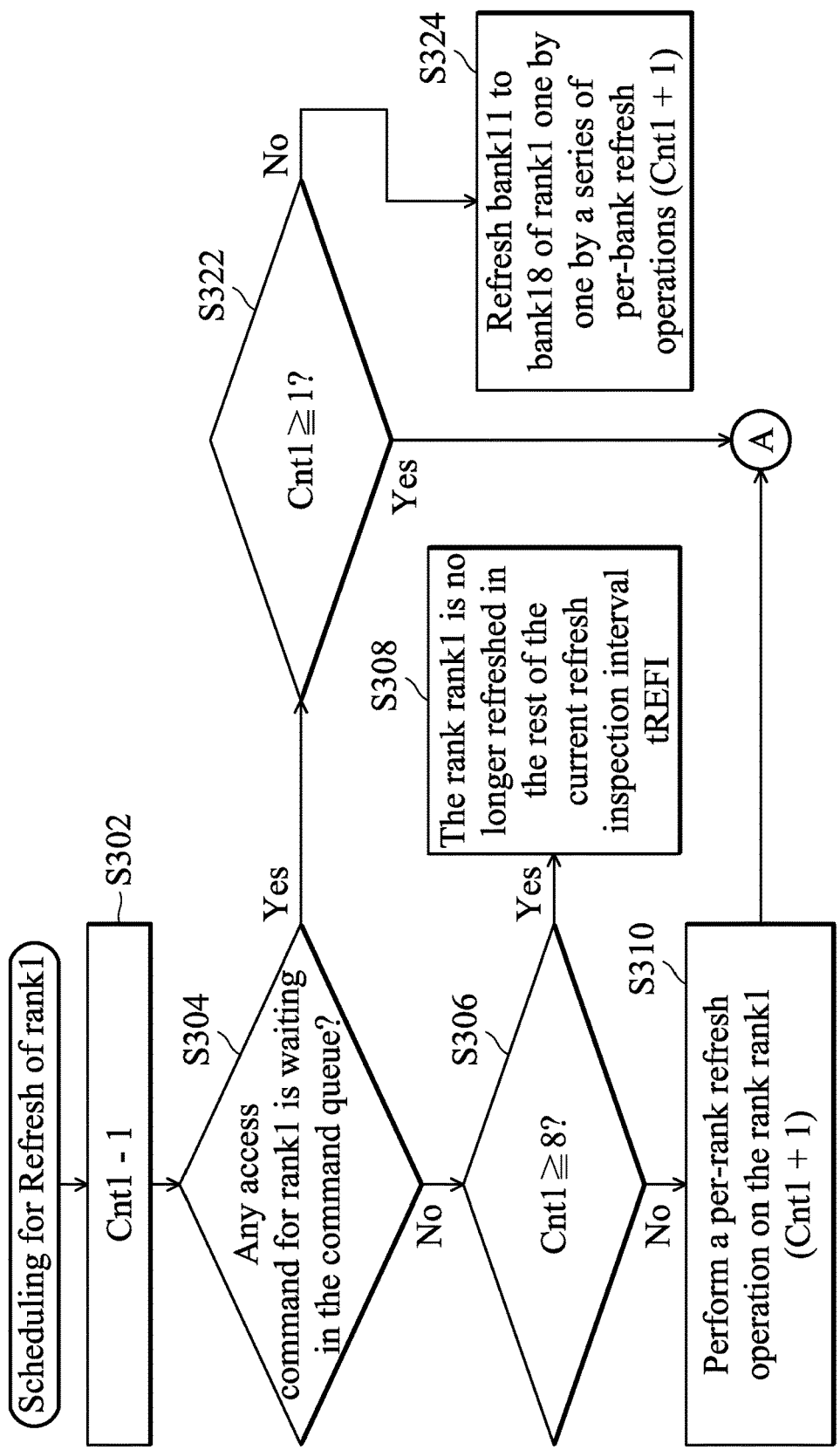
FIG. 3A and FIG. 3B depict a procedure for scheduling the refresh operations of the rank rank1 by the microcontroller 106, which should be performed once every refresh inspection interval tREFI.
Figure 3B:
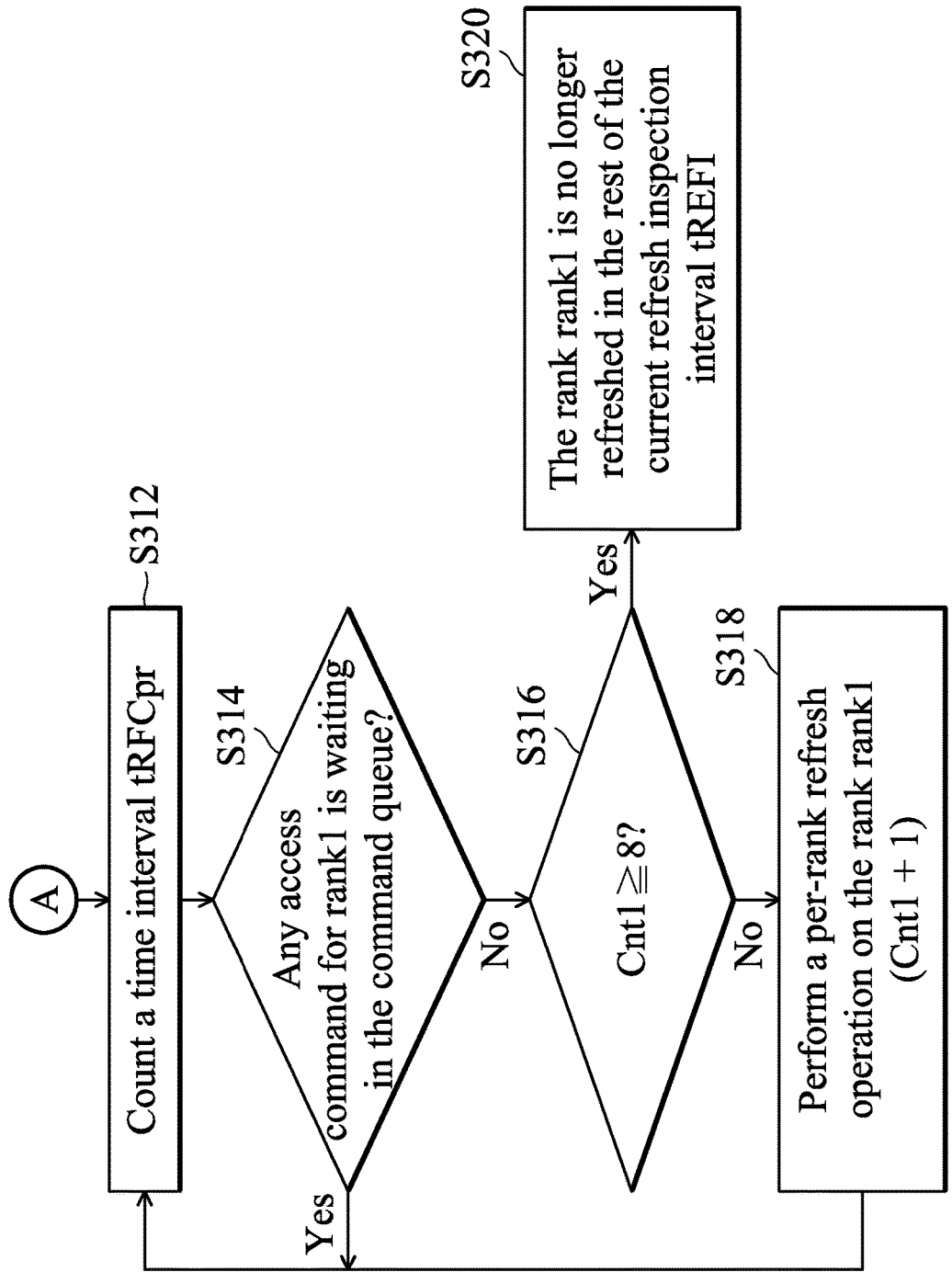

FIG. 3A and FIG. 3B depict a procedure for scheduling the refresh operations of the rank rank1 by the microcontroller 106, which should be performed once every refresh inspection interval tREFI. The microcontroller 106 uses a counter (hereinafter Cnt1) to count how many times the rank rank1 is entirely refreshed (no matter whether it be by one per-rank refresh operation or by a series of per-bank refresh operations). The counter Cnt1 is decreased by 1 in step S302 at the beginning of every refresh inspection interval tREFI. It is determined in step S304 whether any access command for the rank rank1 is waiting in the command queue 104. When no access command for the rank rank1 is waiting in the command queue 104, step S306 is performed to check whether the counter Cnt1 has reached an upper limit (e.g., 8, the number of the banks bank11 to bank 18 contained in the rank rank1). When the counter Cnt1 has not reached 8, step S310 is performed, in which the per-rank refresh operation is performed on the rank rank1 and the counter Cnt1 increases by 1. In step S312, a timer counts a time interval tRFCpr and thereby the single per-rank refresh operation of step S310 is guaranteed finished. Steps S314 and S316 are performed to check the status of the command queue 104 and the counter Cnt1. When it still shows that no access command for the rank rank1 is waiting in the command queue 104 and the counter Cnt1 is still less than 8, step S318 is performed to repeat the per-rank refresh operation on the rank rank1 and the counter Cnt1 is again increased by 1. The per-rank refresh operation based on the status of the command queue 104 and the counter Cnt1 will be repeated until it is determined in step S316 that the counter Cnt1 reaches 8. According to step S320, the rank rank1 is no longer refreshed in the rest of the current refresh inspection interval tREFI. Step S308 is designed based on a similar concept.

When it is determined in step S304 that there is an access command for the rank rank1 waiting in the command queue 104, step S322 checks whether the counter Cnt1 is 0 and thereby determines whether there is an urgent need to refresh the rank rank1 during the current refresh inspection interval tREFI. When the counter Cnt1 is greater than 0, it is not urgent to refresh the rank rank1, and a time interval (e.g. tRFCpr provided in step S312 or others) for execution of the access command queued in the command queue 104 for the rank rank1 is counted. In such cases, the access command queued in the command queue 104 for the rank rank1 is ranked to have the higher priority than the refresh of the rank rank1. When step S314 ensures that no access command for the rank rank1 is waiting in the command queue 104, the free computing resources may be also used in repeatedly performing the per-rank operation on the rank rank1 until step S316 detects that the counter Cnt1 reaches 8.

When it is determined in step S322 that the counter Cnt1 is 0, there is an urgent need to refresh the rank rank1 during the current refresh inspection interval tREFI. In step S324, the banks bank11 to bank18 of the rank rank1 are refreshed one by one by a series of per-bank refresh operations. After wholly refreshing the rank rank1 bank-by-bank, the counter Cnt1 is increased by 1. In this situation, the banks not being refreshed are allowed to be accessed. The access commands queued in the command queue 104 for the rank rank1, therefore, are not excessively postponed due to the refresh operations on the rank rank1. In an exemplary embodiment, the per-bank refresh operations in step S324 may be performed to refresh the banks bank11 to bank18 of the rank rank1 bank-by-bank according to the first-rank bank-refresh time points t11 to t18.

The other rank of the DRAM 100 may be refreshed based on the same concept mentioned in FIGS. 3A and 3B. For example, the microcontroller 106 may provide another counter (hereinafter Cnt2) for the rank rank2 to implement a procedure similar to that described in FIGS. 3A and 3B. The counter Cnt2 may be decreased by 1 at the second-rank bank-refresh time point t21 shown in FIG. 2.

Figure 4A:
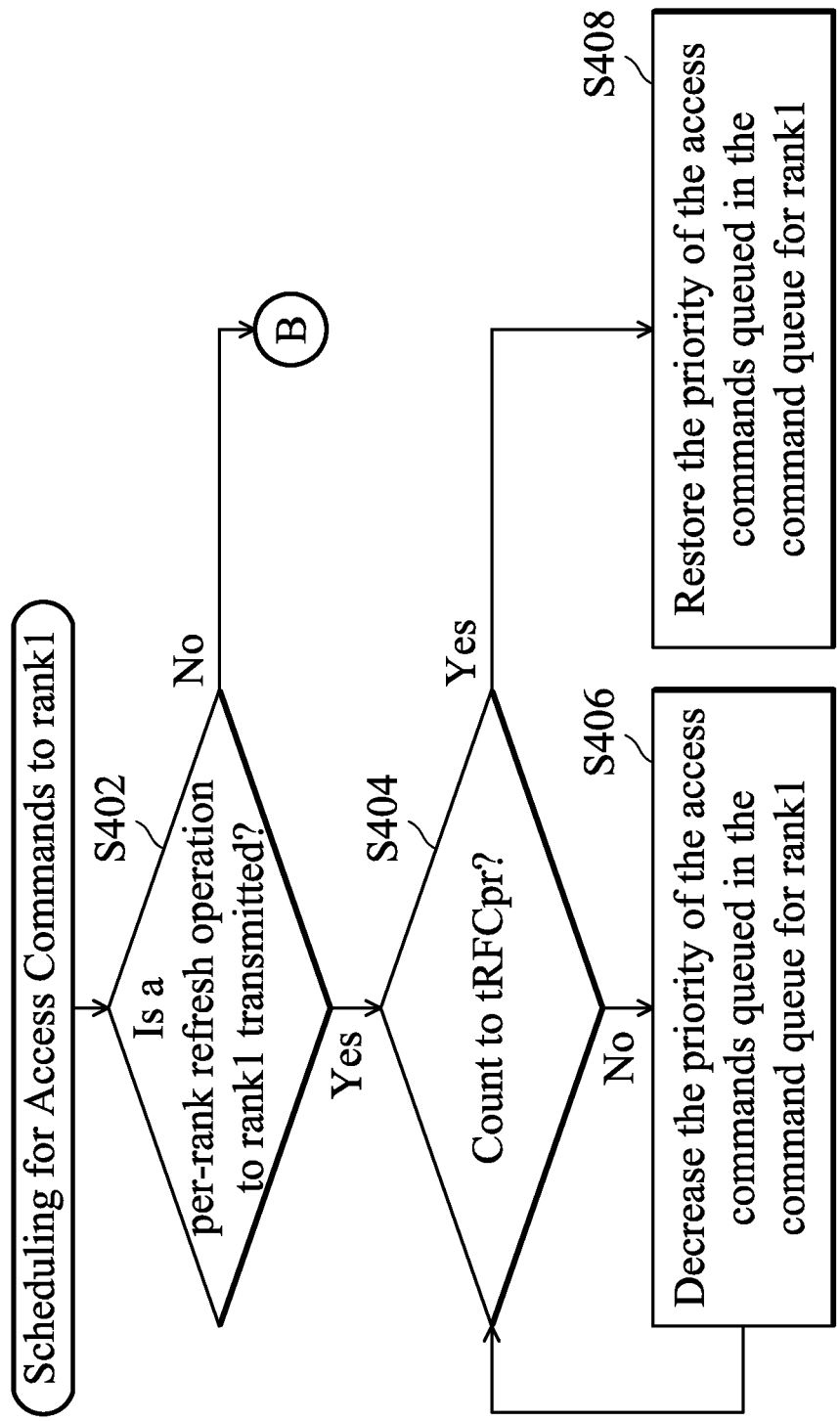
FIG. 4A and FIG. 4B depict a flowchart for scheduling the access commands to the rank rank1 by the microcontroller 106.
Figure 4B:
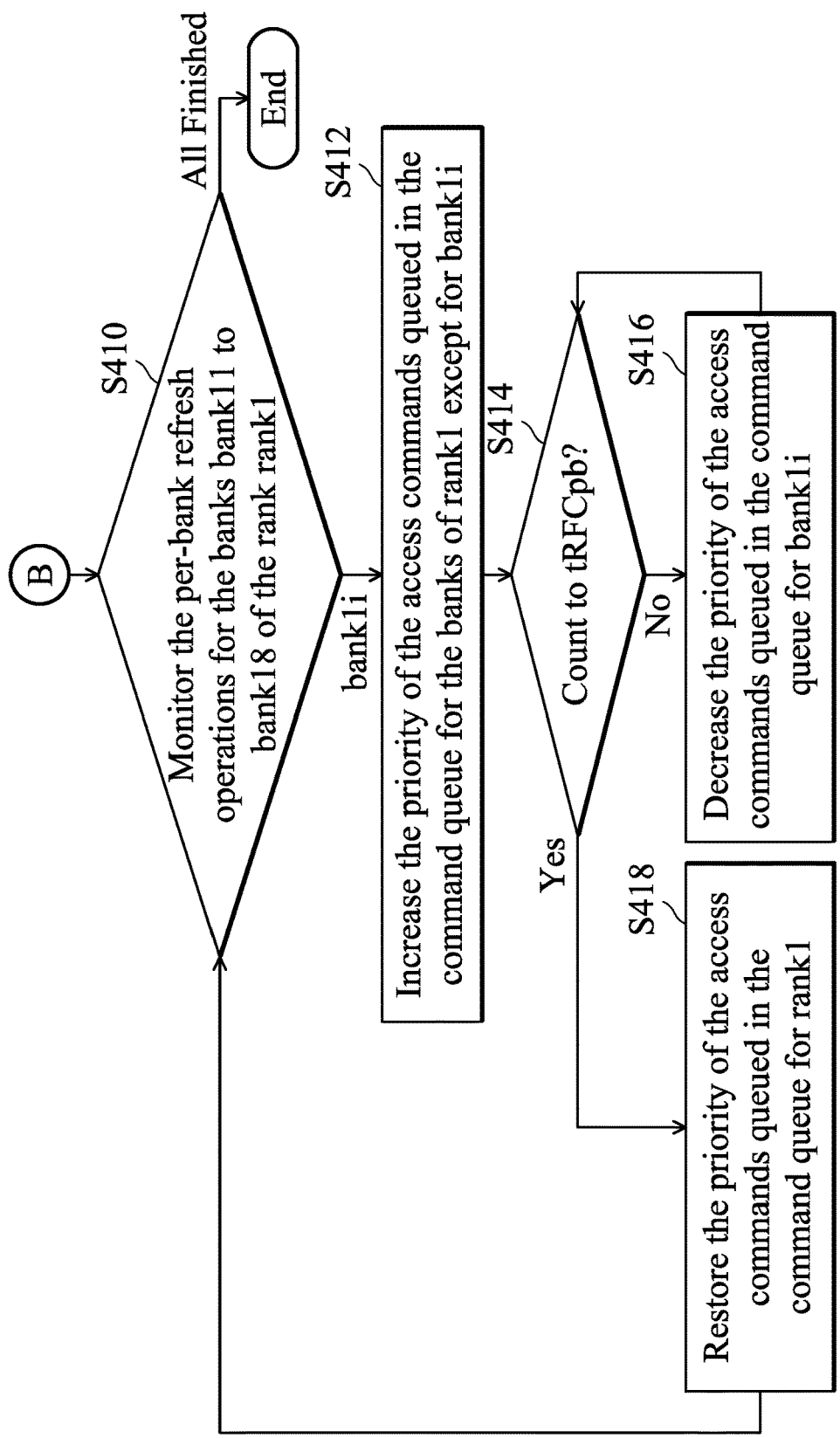

FIG. 4A and FIG. 4B depict a flowchart for scheduling the access commands to the rank rank1 by the microcontroller 106, which is provided based on the refresh schedule mentioned in FIGS. 3A and 3B and should be performed corresponding to every refresh inspection interval tREFI. The transmission of the request for the per-rank refresh operation is checked in step S402 at the beginning of every refresh inspection interval tREFI. When a per-rank refresh operation is performed in the current refresh inspection interval tREFI, step S404 is performed to count the time interval tRFCpr. In cases where the per-rank refresh operation is performed repeatedly, step S404 is performed to count a multiple of the time interval tRFCpr. Before satisfying the time limit, step S406 is performed by the microcontroller 106 to decrease the priority of the access commands queued in the command queue 104 for the rank rank1. Thus, for the rank rank1 that is being refreshed, the corresponding access commands are prohibited from redundantly gaining the computing resources and thereby the whole system is not halted by the refresh of the rank rank1. The access commands for the other ranks, therefore, can be executed fluently without being delayed. When step S404 counts up to the time limit, it means that the per-rank refresh operation has been finished. The microcontroller 106 performs step S408 and the priority of the access commands queued in the command queue 104 for the rank rank1 is raised back.

When it is determined in step S402 that the rank rank1 is not refreshed by the per-rank refresh operation during the current refresh inspection interval tREFI, step S410 is performed to monitor the per-bank refresh operations for the banks bank11 to bank18 of the rank rank1. For the bank bank1$i$ that is currently being refreshed, step S412 is performed to increase the priority of the access commands queued in the command queue 104 for the banks of the rank rank1 except for the bank bank1$i$. Step S414 is performed to count a time interval tRFCpb. Before satisfying the time limit, step S416 is performed by the microcontroller 106 to decrease the priority of the access commands queued in the command queue 104 for the bank bank1$i$. Thus, for the bank bank1$i$ that is currently being refreshed, the corresponding access commands are prohibited from redundantly gaining the computing resources and thereby the whole system is not halted by the refresh of the bank bank1$i$. The access commands not accessing the bank bank1$i$ can timely gain the priority to use the computing resources and are not postponed by the refresh of the bank bank1$i$. When step S414 counts the time interval tRFCpb, it means that the per-bank refresh operation on the bank bank1$i$ has been finished. The microcontroller 106 performs step S418 and the priority of the access commands queued in the command queue 104 are restored (no matter whether they be those raised before or those suppressed before). When it is determined in step S410 the banks bank1$i$ to bank18 have all been refreshed by the corresponding per-bank refresh operations (e.g. after the time point t18 or finishing the current refresh inspection interval tREFI), the procedure ends.

Control methods for DRAM are also disclosed in the disclosure. Any control method applied on a DRAM based on the forgoing concept should be regarded as being within the scope of the invention. According to the disclosed DRAM controller and DRAM control method, refresh operations for a rank (no matter whether it be rank1 or rank2) are dynamically scheduled considering whether the rank is idle. Specifically, instead of being refreshed by the per-rank refresh operation every refresh inspection interval tREFI, an idle rank is repeatedly refreshed during an earlier refresh inspection interval by repeating the per-rank refresh operation. The rank that has been repeatedly refreshed during the earlier refresh inspection interval tREFI does not need to be refreshed in the later N refresh inspection intervals (NxtREFI). The access commands to the rank, therefore, can be timely executed without being delayed by a conventional refresh routine. In another aspect, when refreshing a specific bank of a specific rank, priority of the access commands to the different banks of the specific rank is further dynamically adjusted. The access commands corresponding to the banks that are not being refreshed at present are given the higher priority to gain the system resources. Access commands for the specific rank, therefore, are not excessively delayed in the command queue.

There are different DRAM types. LPDDR3 and LPDDR4 support the per-bank refresh operation. DDR3 and DDR4 supporting the per-rank refresh operation, however, do not support the per-bank refresh operation. For DDR3 and DDR4, step S324 is modified to perform one per-rank refresh operation on the rank rank1. Step S324 is provided to give the refresh of the rank rank1 higher priority than the access commands to the rank rank1. The zero count Cnt1 means that it is urgent to refresh the rank rank1 even though access commands corresponding to the rank rank1 are waiting. The procedure depicted in FIG. 4B for inspection of the per-bank refresh operations is not required for DDR3 and DDR4.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic random access memory controller, comprising:
    a command queue with access commands queued therein, wherein the access commands are queued in the command queue waiting to be transmitted to a dynamic random access memory; and
    a microcontroller, using a counter to count how many times a rank of the dynamic random access memory is entirely refreshed,
    wherein:
    the microcontroller repeatedly performs a per-rank refresh operation on the rank when the counter has not reached an upper limit and no access command corresponding to the rank is waiting in the command queue;
    the microcontroller decreases the counter by 1 every refresh inspection interval;
    when there are access commands corresponding to the rank waiting in the command queue and the counter is 0, the microcontroller refreshes the rank bank-by-bank by per-bank refresh operations;
    corresponding to a per-bank refresh operation to be performed on a single bank within the rank, the microcontroller raises priority of access commands queued in the command queue corresponding to remaining banks of the rank except for the single bank; and
    when finishing the per-bank refresh operation on the single bank, the microcontroller restores the priority of the access commands queued in the command queue corresponding to the remaining banks of the rank except for the single bank.

2. The dynamic random access memory controller as claimed in claim 1, wherein:
    the microcontroller stops repeating the per-rank refresh operation on the rank when the counter reaches the upper limit.

3. The dynamic random access memory controller as claimed in claim 1, wherein:
    when there are access commands corresponding to the rank waiting in the command queue and the counter is greater than 0, the microcontroller gives the access commands corresponding to the rank a higher priority than refresh operations on the rank.

4. The dynamic random access memory controller as claimed in claim 1, wherein:
    when performing the per-bank refresh operation on the single bank, the microcontroller further decreases priority of access commands queued in the command queue corresponding to the single bank.

5. The dynamic random access memory controller as claimed in claim 4, wherein:
    when finishing the per-bank refresh operation on the single bank, the microcontroller restores the priority of the access commands queued in the command queue corresponding to the single bank.

6. The dynamic random access memory controller as claimed in claim 1, wherein:
    when performing the per-rank refresh operation on the rank, the microcontroller further decreases priority of access commands queued in the command queue corresponding to the rank.

7. The dynamic random access memory controller as claimed in claim 6, wherein:
    when finishing the per-rank refresh operation, the microcontroller restores the priority of the access commands queued in the command queue corresponding to the rank.

8. A control method for dynamic random access memory, comprising:
    providing a command queue with access commands queued therein, wherein the access commands are queued in the command queue waiting to be transmitted to a dynamic random access memory;
    using a counter to count how many times a rank of the dynamic random access memory is entirely refreshed;
    repeatedly performing a per-rank refresh operation on the rank when the counter has not reached an upper limit and no access command corresponding to the rank is waiting in the command queue;
    decreasing the counter by 1 every refresh inspection interval;
    when there are access commands corresponding to the rank waiting in the command queue and the counter is 0, refreshing the rank bank-by-bank by per-bank refresh operations;
    corresponding to a per-bank refresh operation to be performed on a single bank within the rank, priority of access commands queued in the command queue corresponding to remaining banks of the rank except for the single bank is raised; and
    when finishing the per-bank refresh operation on the single bank, the priority of the access commands queued in the command queue corresponding to the remaining banks of the rank except for the single bank is restored.

9. The control method for dynamic random access memory as claimed in claim 8, further comprising:
    stopping repeating the per-rank refresh operation on the rank when the counter reaches the upper limit.

10. The control method for dynamic random access memory as claimed in claim 8, wherein:
    when there are access commands corresponding to the rank waiting in the command queue and the counter is greater than 0, the access commands corresponding to the rank are given a higher priority than refresh operations on the rank.

11. The control method for dynamic random access memory as claimed in claim 8, wherein:
    when the per-bank refresh operation is performed on the single bank, priority of access commands queued in the command queue corresponding to the single bank is decreased.

12. The control method for dynamic random access memory as claimed in claim 11, wherein:
    when the per-bank refresh operation on the single bank finishes, the priority of the access commands queued in the command queue corresponding to the single bank is restored.

13. The control method for dynamic random access memory as claimed in claim 8, wherein:
   when the per-rank refresh operation is performed on the rank, priority of access commands queued in the command queue corresponding to the rank is decreased.

14. The control method for dynamic random access memory as claimed in claim 13, wherein:
   when the per-rank refresh operation finishes, the priority of the access commands queued in the command queue corresponding to the rank is restored.

* * * * *